United States Patent [19]
Unger et al.

[11] Patent Number: 5,991,713
[45] Date of Patent: Nov. 23, 1999

[54] EFFICIENT METHOD FOR COMPRESSING, STORING, SEARCHING AND TRANSMITTING NATURAL LANGUAGE TEXT

[75] Inventors: Jay Unger, Darnestown, Md.; Glen Fuller, Cary, N.C.

[73] Assignee: International Business Machines Corp., Armonk, N.Y.

[21] Appl. No.: 08/979,181

[22] Filed: Nov. 26, 1997

[51] Int. Cl.⁶ ............................. G06F 17/28; G06F 17/27
[52] U.S. Cl. ................................ 704/9; 704/1; 707/513
[58] Field of Search ........................... 704/1, 2, 7, 8–10; 707/500, 513, 530, 531, 532; 341/51

[56] References Cited

U.S. PATENT DOCUMENTS

| | | | |
|---|---|---|---|
| 5,099,426 | 3/1992 | Carlgren et al. | 704/9 |
| 5,146,552 | 9/1992 | Cassorla et al. | 707/512 |
| 5,214,696 | 5/1993 | Keiser, II et al. | 704/1 |
| 5,367,621 | 11/1994 | Cohen et al. | 707/501 |
| 5,551,026 | 8/1996 | Kaplan et al. | 704/9 |
| 5,572,643 | 11/1996 | Judson | 709/218 |
| 5,608,396 | 3/1997 | Cheng et al. | 341/50 |
| 5,614,899 | 3/1997 | Tokuda et al. | 341/51 |
| 5,623,601 | 4/1997 | Vu | 395/187.01 |
| 5,680,628 | 10/1997 | Carus et al. | 704/9 |
| 5,708,825 | 1/1998 | Sotomayor | 704/9 |
| 5,721,939 | 2/1998 | Kaplan | 704/9 |
| 5,724,593 | 3/1998 | Hargrave, III et al. | 704/2 |
| 5,740,060 | 4/1998 | Del Monte | 704/7 |
| 5,890,103 | 3/1999 | Carus | 704/9 |

FOREIGN PATENT DOCUMENTS

WO 96/29663   9/1996   WIPO ............................. G06F 17/30

*Primary Examiner*—Joseph Thomas
*Assistant Examiner*—Patrick N. Edouard
*Attorney, Agent, or Firm*—Robert C. Bertin; A. Bruce Clay

[57] ABSTRACT

A method for compressing text includes steps of parsing words from text in an input file and comparing the parsed words to a predetermined dictionary. The dictionary has a plurality of vocabulary words in it and numbers or tokens corresponding to each vocabulary word. A further step is determining which of the parsed words are not present in the predetermined dictionary and creating at least one supplemental dictionary including the parsed words that are not present in the predetermined dictionary. The predetermined dictionary and the supplemental dictionary are stored together in a compressed file. Also, the parsed words are replaced with numbers or tokens corresponding to the numbers assigned in the predetermined and supplemental dictionary and the numbers or tokens are stored in the compressed file.

9 Claims, 14 Drawing Sheets

```
<! DOCTYPE HTML PUBLIC " -//W3C//DTD HTML 3.2 FINAL//EN">
<HTML>
<H1>
<TITLE>BASEBALL,/TITLE>
</H1>
<H2>TEAMS</H2>
        :
        :
<H3>1996 Statistics</>
        :
<H3>1997 Statistics</>
        :

<BODY>
```

FIG. 2

EFFICIENT METHOD FOR COMPRESSING, STORING, SEARCHING AND TRANSMITTING NATURAL LANGUAGE TEXT

FIELD OF THE INVENTION

The present invention relates to information storage and retrieval systems. Specifically, the invention is directed to a method for tokenizing and compressing text. The method is ideally suited to text compression within a distributed linked file system such as hypertext markup language ("HTML") files stored on the internet.

BACKGROUND OF THE INVENTION

In distributed linked file systems like the World-Wide Web on the internet, there is frequently a need to store large amounts of information written in natural languages (such as English or German) as plain text in server systems and then to transmit that text information to other server or client systems efficiently. Additionally, there is a requirement to be able to perform full-text searches on all or part of the material stored quickly and efficiently either in client or server computers. These requirements exist not only in hypertext systems like the World-Wide Web on the internet, but also in distributed information query and retrieval systems or in database systems that accommodate storage of long text streams. Present methods of data compression that operate uniformly on all binary stored information are not necessarily well suited to supporting these long text streams both in terms of compression and decompression efficiency.

There are a number of conventional compression schemes, for example the compression scheme disclosed in U.S. Pat. No. 5,099,426 to Carlgren et al. hereby incorporated by reference herein. While conventional systems such as that disclosed in U.S. Pat. No. 5,099,426 use word tokenization schemes for compression, they suffer from several inefficiencies that make them less suitable for distributed systems use. In conventional systems, tokens (word numbers) assigned to each unique word in the text are determined by processing the specific text to be encoded and developing a table that ranks the words by frequency of occurrence in the text. This document specific ranking is then used to assign the shortest tokens (typically 1-byte) to words having the highest frequency of occurrence and to assign longer tokens to the less frequently occurring words.

While conventional encoding achieves a high degree of compression it creates several other inefficiencies, particularly in a distributed hypertext system like the World-wide Web. First, each document has its own unique encoding for each word. Thus, in one document the word "house" might be assigned a numeric value of 103, and in another document the word "house" might be assigned the number 31464. This document specific tokenization means that a unique table or vocabulary must be maintained as part of each document that maps the tokens assigned to words. Second, a vocabulary table must be stored with the compressed text and must be transmitted with compressed text to any processor (client or server) that will either further store, search or decompress the document. Third, when such a frequency table is used as the primary mechanism for determining the encoding of tokens in the compressed text, the assignment of tokens to words is so tightly optimized to the frequency distribution of words in the particular encoded document that when the existing text needs to be updated by even a few words or phrases the entire encoding scheme must be redone to accommodate any new strings that may be present. Fourth, in order to encode strings of characters that do not constitute natural language words, the strings are assigned their own unique tokens. Examples of such character strings are numeric values, codes, table framing characters or other character-based diagrams. While conventional compression methods may be acceptable when documents contain only a small number of such strings, the encoding scheme can break down if the document requires representation of larger numbers of such strings. Examples of documents that might be difficult to encode are those that contain scientific or financial tables that have many unique numbers. Fifth, the close optimization of token assignment to word frequency may be complicated with documents that contain large numbers of unique words. Examples of these kinds of document include dictionaries, thesauri, and technical material containing tables of chemical, drug, or astronomical names. Lastly, conventional compression techniques do not easily accommodate documents that include text from more than one national natural language, such as for example a translated document that includes both U.S. English and International French.

SUMMARY OF THE INVENTION

A method of efficient compression, storage, and transmission according to the present invention takes advantage of the fact that most of the text manipulated by distributed information systems is, in fact, written in natural languages comprised of a finite vocabulary of words, phrases, sentences, etc. . . . For example, in a common U.S. English business communication it is normal to find that a vocabulary of under 2000 general words, augmented by about 100–200 special terms that are specific to the type of business being discussed, generally serves adequately.

The method achieves significant efficiencies over prior art by using a set of predetermined dictionaries or vocabularies that are specific to the national language (such as English and/or German) and possibly the subject area (such as Medical, Legal or Computer Science) of the textual information being encoded, stored, searched and transmitted.

The method includes steps of parsing words from text in an input file and comparing the parsed words to a predetermined dictionary. The dictionary has a plurality of vocabulary words in it and numbers or tokens corresponding to each vocabulary word. A further step is determining which of the parsed words are not present in the predetermined dictionary and creating at least one supplemental dictionary including the parsed words that are not present in the predetermined dictionary. The predetermined dictionary and the supplemental dictionary are stored together in a compressed file. Also, the parsed words are replaced with numbers or tokens corresponding to the numbers assigned in the predetermined and supplemental dictionary and the numbers or tokens are stored in the compressed file.

BRIEF DESCRIPTION OF THE DRAWINGS

The invention is more fully described with reference to the accompanying figures and detailed description.

FIG. 2 depicts a conventional typical hypertext markup language ("HTML") file.

DETAILED DESCRIPTION OF THE INVENTION

Defining the Scope of a Collection

Figure 1:
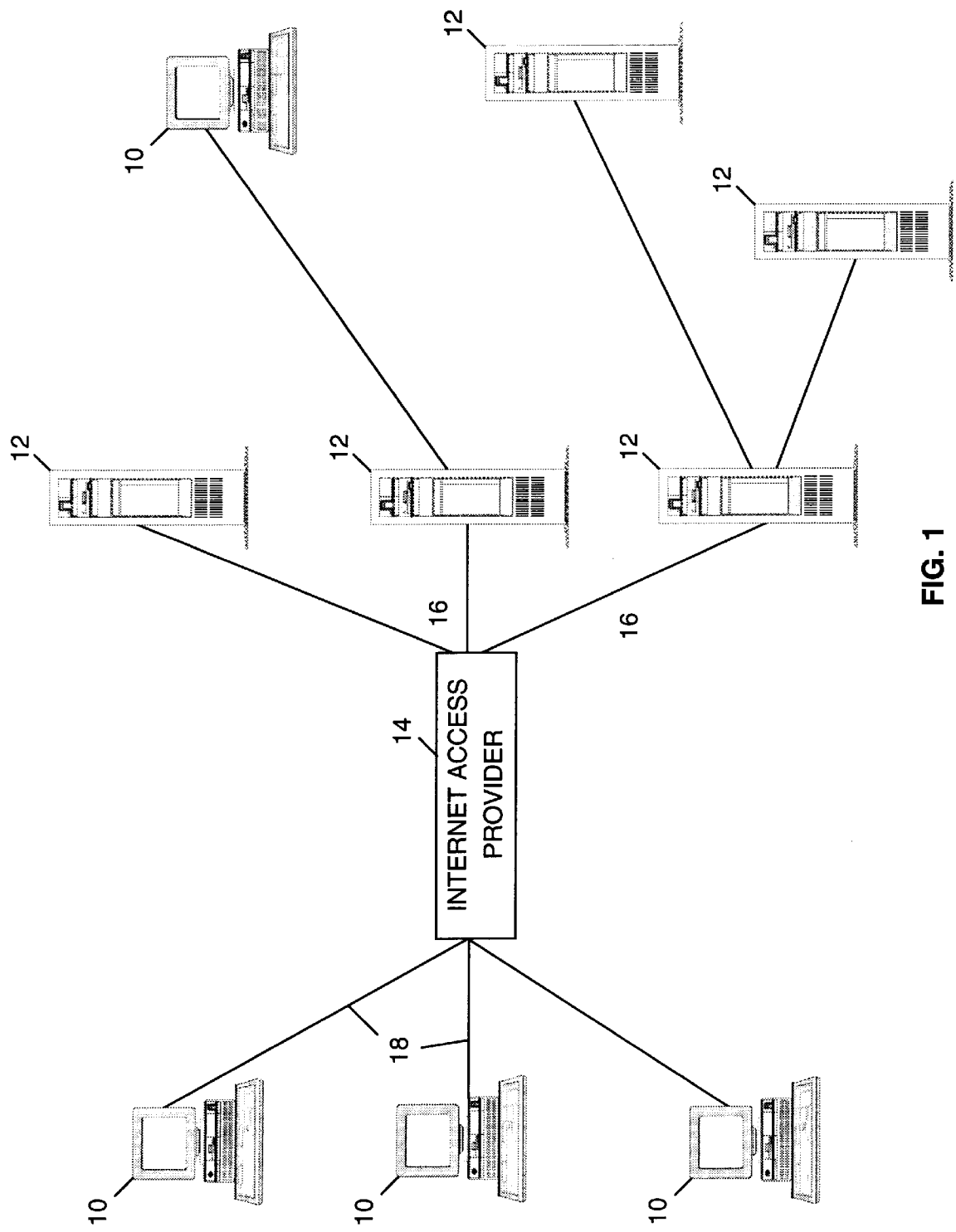
FIG. 1 depicts a view of conventional information storage and retrieval systems on the internet.

FIG. 1 depicts a view of the internet. A plurality of client computers 10 are coupled to a plurality of interconnected server computers 12 over the internet. Each client computer 10 may be coupled to the internet in various ways including through an internet access provider 14 and through a server computer 12. Client computers 10 are coupled to an internet access provider 14 through lines 18, which represent communication channels such as a telephone line from a modem of the client computer 10 to the internet access provider 14. The client computer 10 may also be coupled to the internet via a local area network connection to a server 12, for example using an ethernet or a token ring network. The servers 12 are coupled to each other and to the internet service provider 14 through a plurality of interconnected networks and communication links, represented by lines 16, that collectively comprise the internet.

Each of the servers 12 has a unique identifier or name that can be used to communicate with it. Typically these server names are expressed as character strings, for example www.ibm.com that are translated by mechanisms in the network to unique numeric addresses pursuant to the well known internet Domain Name System ("DNS"). The server's name along with additional characters that identify a specific web-page constitute an identifier known as a Uniform Resource Locator (URL). While this information can be anything that identifies the requested material, this additional information is frequently file and/or directory names that reference the file system on the server 12.

A common method of accessing information on the internet is with a browser residing on the client computer 10. Toward this end, information on the server computers 12 is typically stored in a format that is usable by browsers. Typically, this format is hypertext markup language ("HTML"), which is readable. The browser enables a user at the client computer 10 to receive HTML files transmitted from server computers 12 using widely available protocols, including the hypertext transfer protocol ("HTTP"). Once received, the HTML file is rendered by the browser as a page (or "web page"). Rendering includes displaying text, pictures, and video and playing recorded sound. Commonly available browsers include Netscape Navigator, Mosaic, and Internet Explorer supplied by Microsoft corporation.

FIG. 2 depicts a typical HTML file. HTML files include a plurality of tags with corresponding text and objects. The objects include, for example, pictures, sound, and video. The tags specify how to format the corresponding text and objects for rendering by the browser. For example, the <P> tag preceding a block of text indicates that the ensuing text is to be formatted and displayed as a paragraph. Typically, though not always, a format is specified with two tags, a beginning and an ending tag which surrounds the text or object corresponding to the format. For example, referring to FIG. 2, the title "baseball" is given to an HTML file as follows:

<TITLE>Baseball<\TITLE>

The tags used in HTML allow a user to identify many different types of text including paragraphs, titles, headings, citations, emphasis, numbered and or unnumbered lists etc. Tags can also enclose, or nest, other tags providing a combination effect. While these tags do not explicitly specify how the text they enclose is to be formatted there are conventional rules as to how each type of text should best be formatted for display. Additional data called attributes may be specified with tags that specify that a particular presentation format be imparted to the text. For example, attributes on tags allow authors of HTML files to specify many text formats including: right, left and center justification, boldface or italics. Other tags allow authors to embed pictures, video, and sound or other non-text objects into HITML files. Typically, these tags specify the location and size of the object as well as the location of the object file on the internet.

The most powerful feature of HTML is the hypertext link tag. This tag allows an author of one HTML file to specify links to a plurality of other HTML files. Thus, when an HTML file is displayed as a web page on a user's browser, the user may select one of the hypertext links and instantly redirect their browser to request and render the web page corresponding to the selected link.

Figure 3:
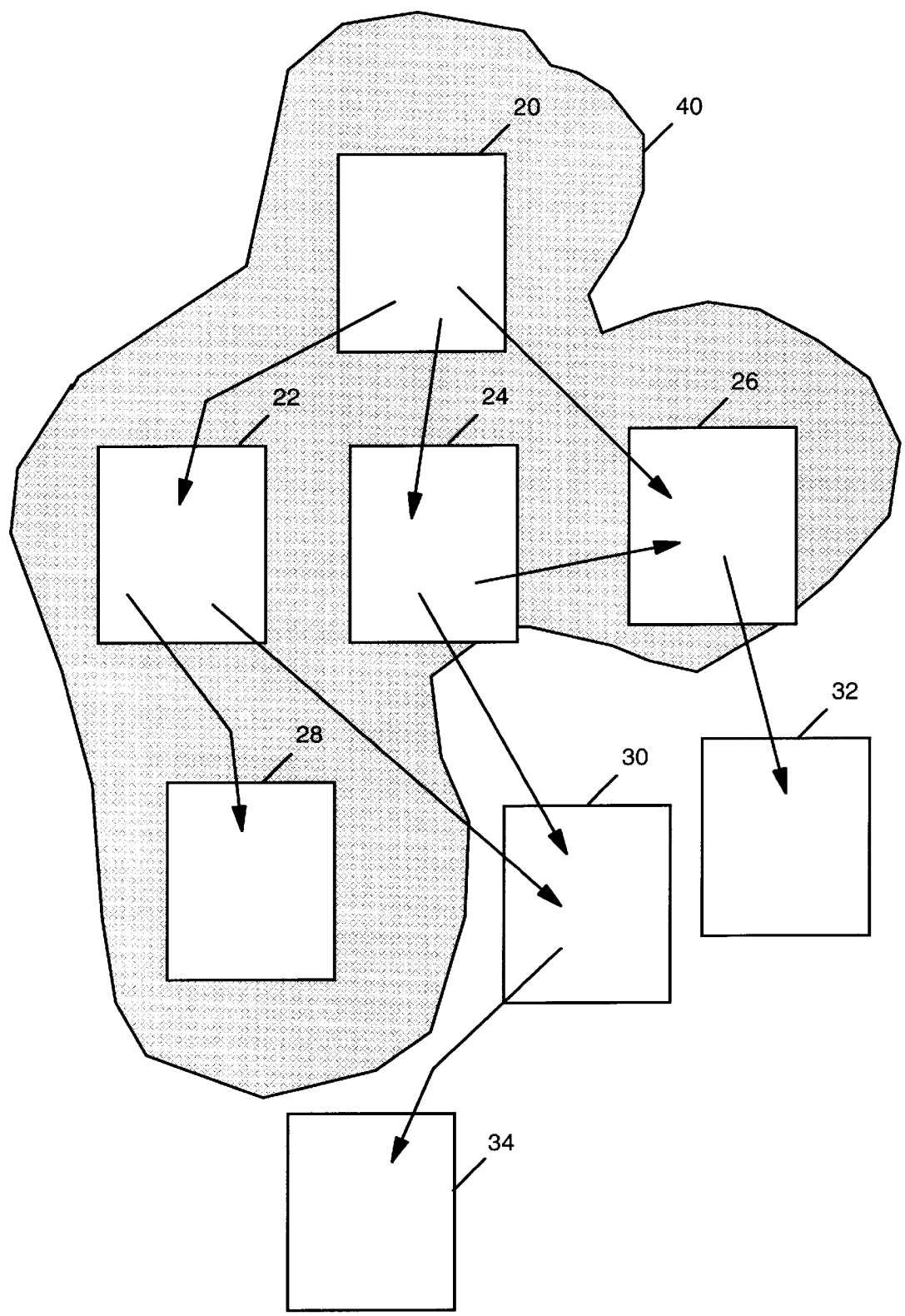
FIG. 3 depicts a plurality of HTML files stored on the internet contained within a boundary for illustrative purposes.

FIG. 3 depicts a plurality of HTML files stored on the internet for illustrative purposes. The HTML files may reside on the same server 12 or on separate servers 12 coupled to the internet. File 20 includes hypertext links to files 22, 24 and 26. File 22 includes hypertext links to files 28 and 30. File 24 contains hypertext links to files 30 and 26. Similarly, file 26 contains a hypertext link to file 32.

An author desiring to render access to some or all of the hypertext files depicted in FIG. 3 more efficient, according to the present invention, identifies the files which are to be included a collection. Prior to creation of the collection , the user must select which files to include. For example, referring to FIG. 3, a user may include in the collection all of the files within the boundary 40. The boundary 40 is typically chosen by the author because they know that files 20 through 28 share a common characteristic, for example, they all pertain to baseball players. Files 30 through 34 may be excluded from the collection because the files are less relevant to the common characteristic.

The methods used to determine the scope of hypertext material, such as but not limited to tagged HTML, SGML or XML files, to be included in a collection may either be manually specified or automatically developed from the linked structure of the material. Manual specification identifies existing sets of files, database entries, or previously existing collections to be included in or excluded from the collection process. For example, on the World Wide Web, such manual specification might include lists of server sites, file directories or URL text string patterns that are to be considered within (or ruled out of) the scope of the binding operation.

In additional to this manual "scoping", the collection process also employs automatic hypertext link traversal to discover candidate material. In this process the method examines the hypertext material, much as an appropriate browser would, to uncover links to other material and possibly add it to the collection. This operation is performed recursively. That is each, each discovered link is examined for further links which may be taken and so on. When this automatic method of discovering material is used one or more "starting points" or "home pages" in the hypertext tree are identified by the author. Additionally, the author may also specify that the binding software traverse all of the hypertext links within the candidate space established by the previously discussed scoping methods until a set of constraint parameters are met. Such constraint parameters include, but are not limited to, a single link, some specified number of link levels, links contained within a whole or partial specification of a document's base statement, mandatory vs. discretionary links, etc. This technique lends itself to quickly binding structured collections of material which have some logical ordering determined by the linked structure of the components themselves.

Beyond simply developing the scope of the collection, the methods according to preferred embodiments of the invention establish a structure for the material that is included in the collection. This structure may be likened to a composite "table of contents" for all of the material included in the scope of the collection by the aforementioned methods. This structure is accumulated in primary or auxiliary memory as the binding operation proceeds and the relationship between all the included objects is recorded. Once the traversal process is complete, this table constitutes a complete record or "graph" of the hypertext interconnections within the collection and it can be used in the subsequent process of creating additional organizational aids for the collection.

Even when there are few or no explicit links between the individual components of the collection, the graph at least defines which objects are part of the collection. For example, if the author specifies that all the HTML files in a certain area of storage (a directory, disk or site) are to bound into a collection, and none of these files contained any hyperlinks to any of others that were present, the resulting graph would contain at least a simple list of all the HTML files that were included and some default ordering for the material.

Organizing the Collection ("HyperBinding")

Figure 4:
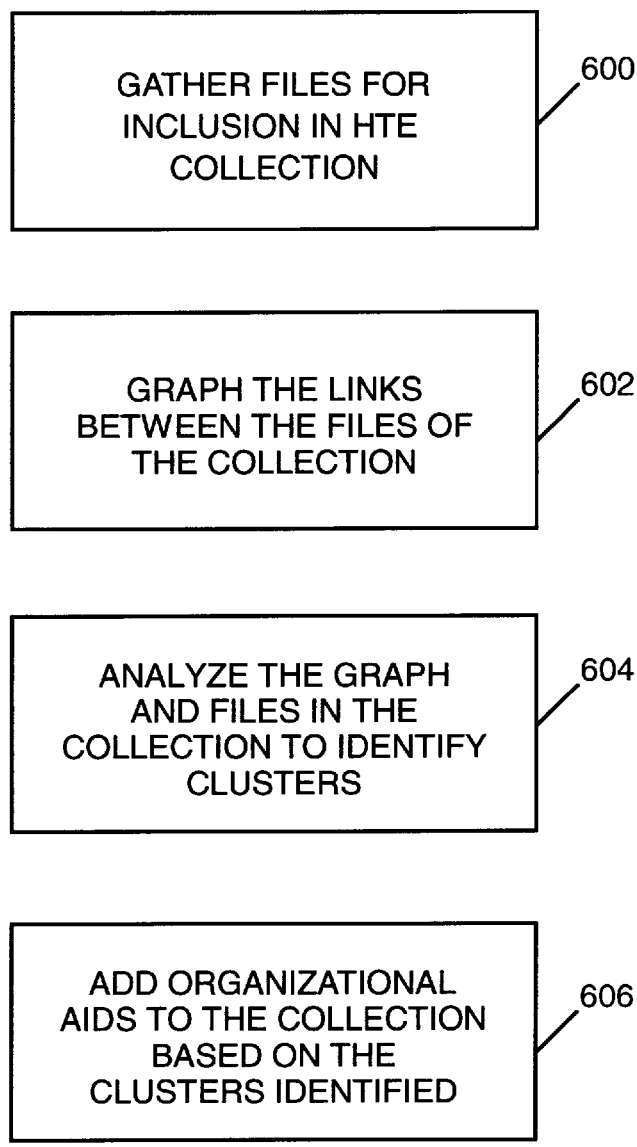
FIG. 4 depicts a method according to a preferred embodiment present invention for collecting a group of linked files and hyperbinding the collection.

A method for organizing a collection is depicted in FIG. 4. In step 600, the scope of the files included within the collection is determined as described above. In step 602, a graph of the material within the collection is identified as described above. Then, in step 604, the organization of the material within the collection is analyzed and in step 606 organizational aids are added to the collection by an additional process called HyperBinding. HyperBinding is a process that examines the map of the collection to create new pages and links to include in the HyperBound collection to enhance its usability.

The most basic form of this process, called "static hyperbinding", simply uses the information collected in the map constructed by previous steps to construct new links and navigational information such as buttons and menus to allow the user to easily traverse the relationships represented in the collected map. This mechanism creates lists and tables corresponding to the hierarchy of links represented in the map but factors those links away from the body of text. These lists then allow the user to see the structure of the material separately from the body of the data. This works well in many cases because hypertext authors frequently include sufficient links in their material that expose the implied organization of the data even though they do not necessarily include all the navigational pages and links that a user may desire.

In some cases, however, there is little or no explicit structure that can be easily discerned from simple examination of the mapped objects. This may be the case either because there are not many links between the objects in the collection, or because there so many relationships expressed in links that is difficult or impossible to discover which links constitute a valuable organization of the material. When this is the case a more sophisticated technique is employed. What is termed "dynamic hyperbinding" examines the record of relationships created by the previously described steps and analyzes them to detect patterns in the "graph" that could offer organizational value.

One form of dynamic hyperbinding involves automatic structural analysis of the link graph to discover clusters of strongly related material. Based on the mapped structure of links, a link density clustering analysis involves determining where many hyperlinks connect a common set of objects. There will frequently be more than one density cluster identified for a given collection. In a given set of n linked hypertext objects there may be as few as n−1 links connecting them or as many as $(n^2-n)/(n-1)$ in a fully connected mesh. In determining when a cluster exists the ratio of the number of hypertext objects that constitute the candidate group of objects to the number of links that connect them is a measure of the density of their interconnection. Candidate objects for inclusion in possible clusters may be located either by recursively traversing the graph or more efficiently by locating nodes in the graph that are either pointed to by many others nodes or that themselves point to many other nodes. In discovering clusters, both the number of times a particular object is targeted and also where it is targeted from are important. For example, the link density of a cluster containing an object targeted from 50,000 other objects will be low (near n−1) and therefore probably not identified as a cluster. On the other hand, if one object is targeted from a hundred pages, and each of those hundred pages is in fact targeted from a single web page, then the link density of this cluster would be higher (equal to 2*(n−1)) and it might be identified as cluster. In a candidate list of pages that were all pointing to each other the density would approach $(n^2-n)/(n-1)$ and would almost certainly be a cluster.

Figure 5:
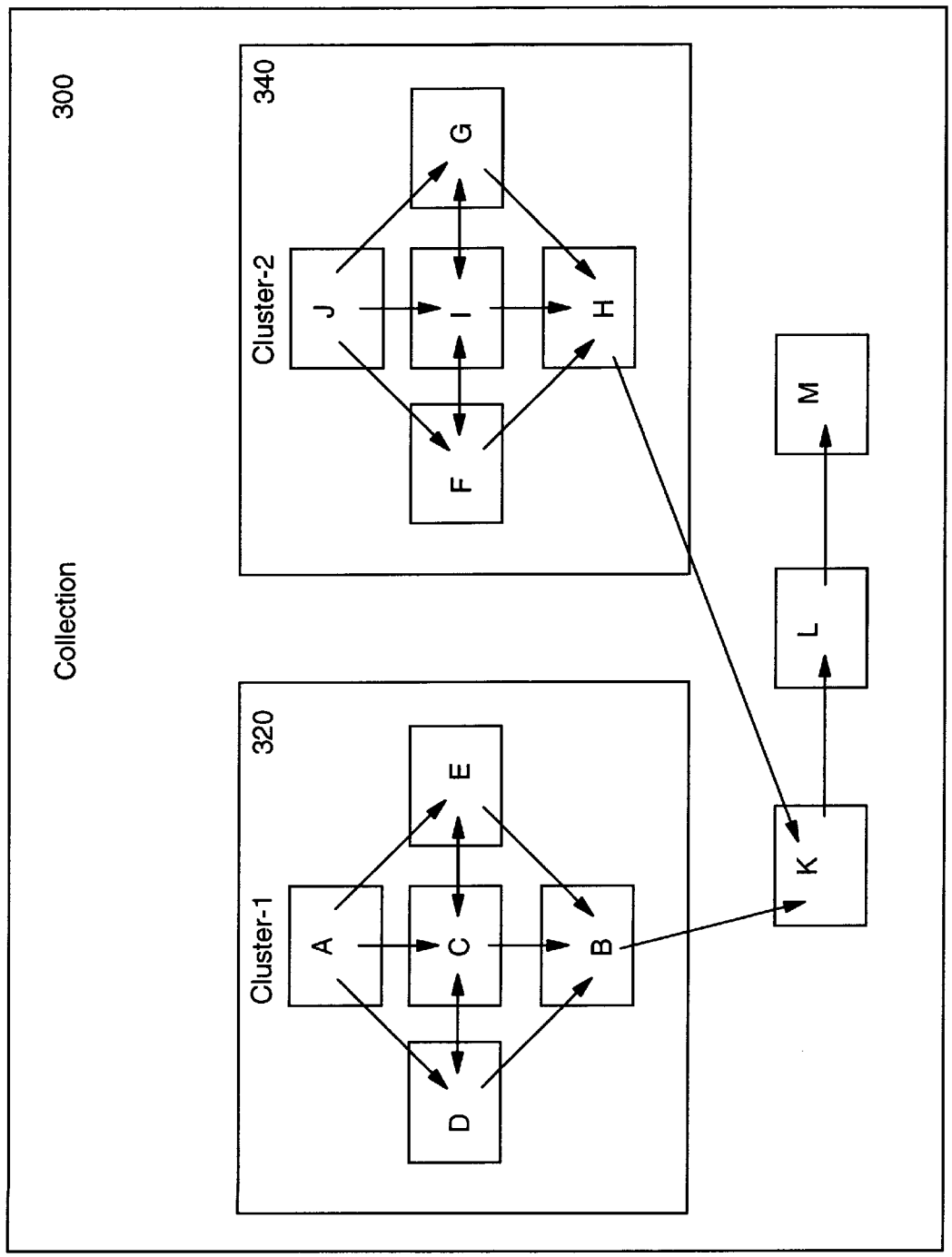
FIG. 5 depicts a collection of hyperlinked files stored in a distributed information system

Referring to FIG. 5, the nodes (or linked files) A, D, C, E, B have ten links between the five objects. Therefore the link density is 2. The group of items J, F, I, G, H also has ten links among five items and would have the same link density. However the items E, B, K, L, M, F, H only have six links among seven objects yielding a link density of less than 1. By establishing a threshold based on the link density, a criteria for defining a cluster is created. Assuming a threshold of 1.5, the two clusters 300 and 350 would be identified because each has a link density in excess of the threshold. By contrast, files E, B, K, I, M, F, and H with a link density of 1 would not constitute a collection. Furthermore, the total size of a candidate cluster is also a factor in determining its value. Very small clusters that only contain a few objects would not be of value in very large collections. Also very large clusters that contained most of the items in the collection would similarly be of little value.

In another form of dynamic hyperbinding a different clustering analysis is performed. Here not only the map of the relationship between hypertext objects is examined, but also the actual language content of the pages is exploited. In document context analysis, linguistic and statistical analysis methods including phrase identification, word frequency analysis, and situational ranking is used to determine the content of a hypertext object. Situation ranking categorizes word and phrase location in the document (such as within a title, heading level, or a list-item) along with simple language frequency. More sophisticated language processing such as grammatical structure and usage analysis may also be employed to categorize the hypertext object. Clusters are then determined by relating files within the collection that have similar semantic or linguistic content.

In both forms of dynamic hyperbinding, once the clusters have been identified by the binding software, the software can examine the objects outward from the center of one or more clusters, trying to find an edge of relevant material for each cluster. The most dense spot in a cluster (the logical center) may be identified by finding the node that has the largest number of links from and to it.

Figure 6:
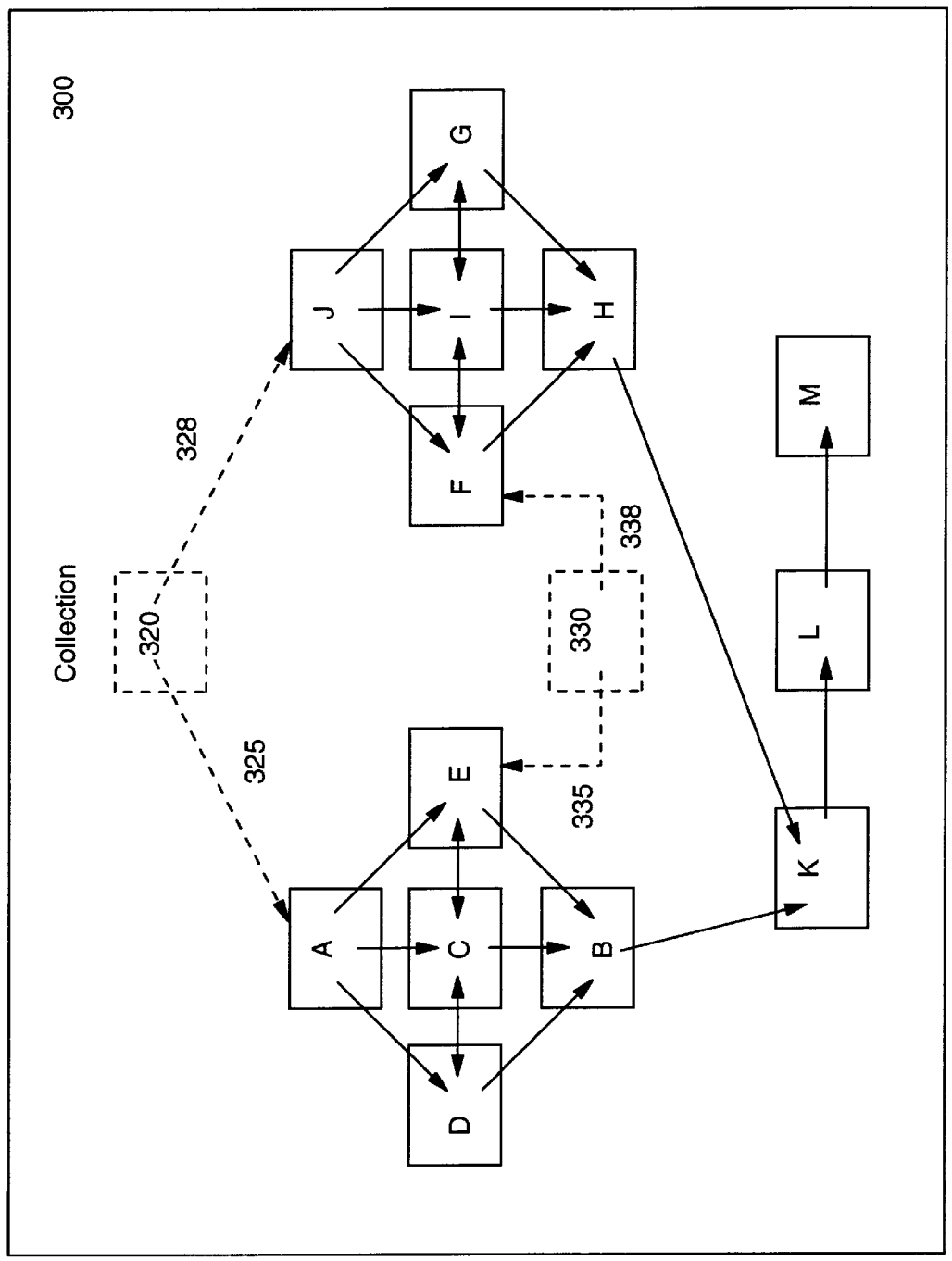
FIG. 6 depicts the collection of hyperlinked files shown in FIG. 5 with organizational aids including hypertext links added to the collection.

In both static and dynamic hyperbinding, once the scope of the collection has been specified identified, and possible organizational groups have been identified as is shown in FIG. 5, additional organization aids (typically hypertext links) can then either be automatically added to the collection or interactively added with the participation of an author or editor. FIG. 6 shows two such additional navigational aids. The first navigational aid 320 is a hypertext page added to the collection that appears similar to a "table of contents". The page 320 includes hypertext links 325 and 328 pointing to file A and J respectively. File A and J are hierarchically the first two pages in the clusters 320 and 346 identified in FIG. 5. The page 320 was created by the "static hyperbinding" method of traversing the map created in previous steps. A second navigational aid in the form of a page 330 was also added by hyperbinding. Page 320 contains hypertext links 335 and 338 that point to pages C and I that are at the center (point of highest cluster density of the clusters identified in FIG. 10. Page 330 can be thought of as a "subject" map that is like the "back of the book index" in printed material.

These additional hypertext links may take the form of lists and tables that in turn point to other lists and tables so that all or part of the total collection of organizational material may be seen by the user. These hyperlinks also point directly to the referenced material, and may have associated text and graphical information, so that the user may easily navigate directly to a reference page from the list or table. These navigational additions to the collection give the user a "sense" of their "position" within the overall collection which can be valuable in helping them to determine how they might use the rest of the data that is part of the collection.

When used either individually, or in combination, the methods and mechanism of hyperbinding create a hypertext collection that is more easily managed than the individual hypertext pages that make it up. Such a collection is more readily navigated, searched, printed, transmitted and manipulated than the individual objects that comprise the collection.

Compiling Hypertext Material

Figure 7:
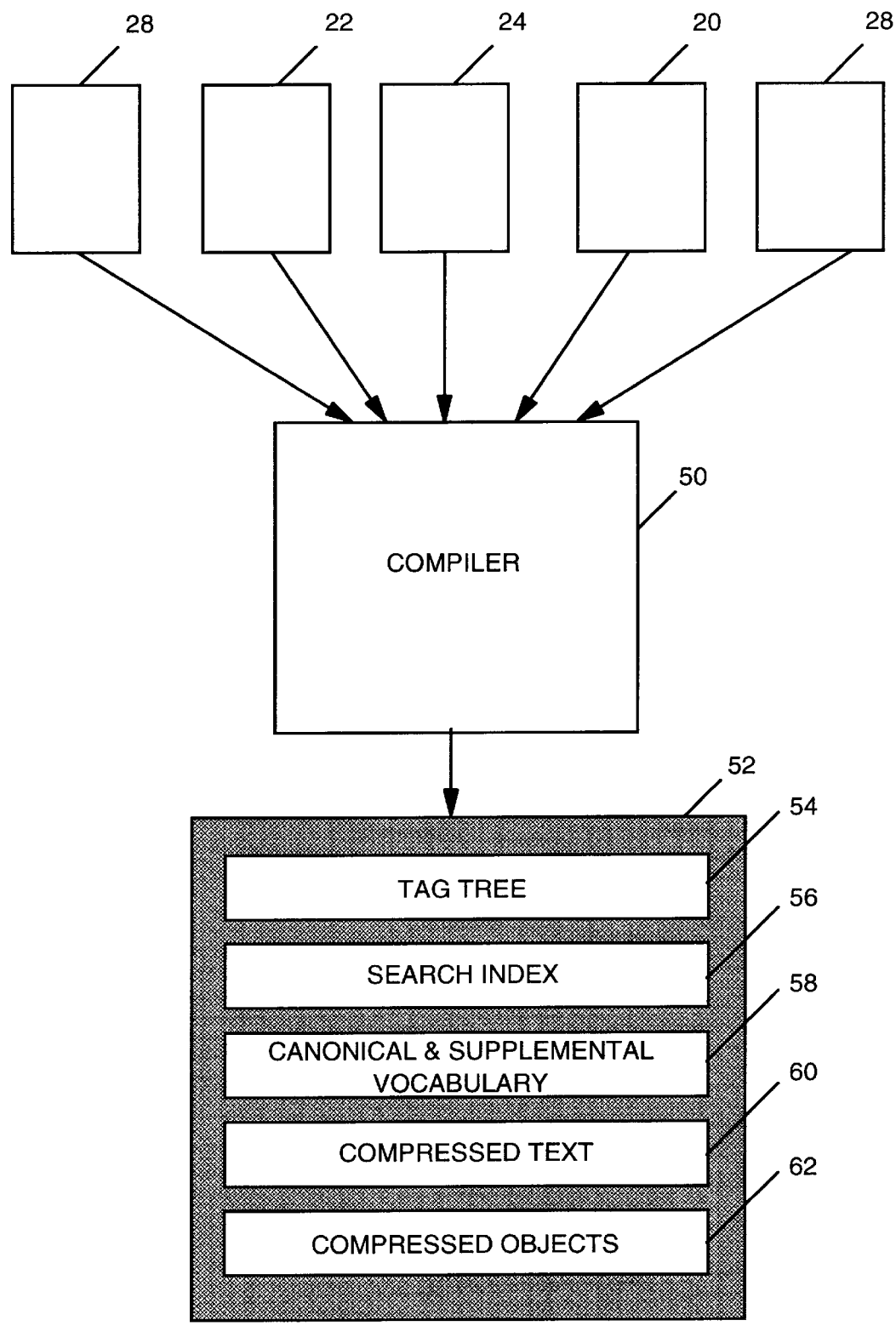
FIG. 7 depicts a compiler 50 operating on HTML files within a boundary and producing a compiled HTML file therefrom according to a preferred embodiment of the invention.

FIG. 7 depicts a compiler 50 operating on the hypertext material within the boundary 40 and the resulting output of a compiled file 52. The compiled file 52 includes a tag tree 54, a search index 56, a canonical and supplemental vocabulary 56, compressed text 60, and compressed objects 62. The contents of the compiled file 52 correspond to the contents of each of the hypertext files that were fed into the compiler 50 as well as the hypertext links between the files. The tag tree includes the structure of each individual file that was fed into the compiler. In addition, each tag includes a pointer to a place within the compiled file that includes the data corresponding to the tag. Thus, each tag in the compiled file points to either compiled text, or a compiled object. When the tag is a hypertext link to another object in the compiled collection the pointer points to another tag in the structured tag tree.

Figure 8:
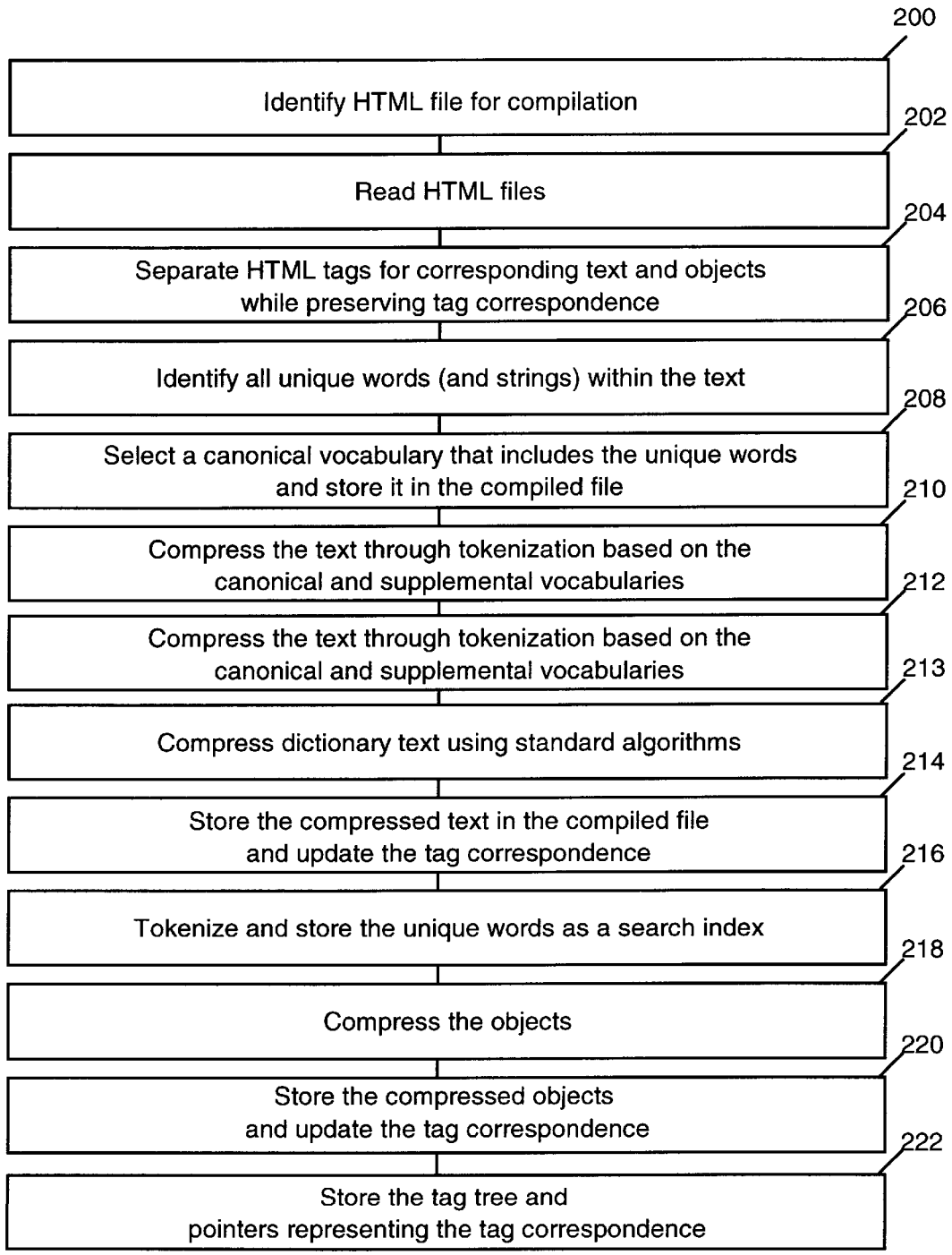
FIG. 8 illustrates a method for compiling a file according to an embodiment of the present invention.

FIG. 8 depicts a method for compiling hypertext according to the present invention. In step 200, the author identifies the hypertext objects for compilation as those within the boundary 40, selected for their relevance to the common subject of baseball players. The author can identify files for compilation to the compiler in various ways, including by supplying the compiler with their hypertext addresses (for example URLs of the HTML files). In addition, the author may use static or dynamic hyperbinding to create a hyperbound document for compilation.

In step 202 the compiler retrieves each file. The retrieval process includes fetching each object identified to the compiler, and in addition, fetching required objects that are referenced by tags within those files. These referenced files will frequently be either other hypertext files or object files representing a stored picture, video, or sound.

In step 204, the compiler parses the hypertext file in order to separate the tags from the corresponding text and objects. A correspondence table is created to preserve the relationship between the tags and the corresponding text and objects.

In steps 206 through 214 the compiler compresses the text contained within the files and stores the compressed text in accordance with a preferred method of compression and storage detailed below. Although the compression method set forth below is preferred, for purposes of compressing the compiled file, compression may be performed with any suitable technique including: Huffman, Lempel-Ziv or simple run-length encoding.

Compression and Storage Methods

The method of compression set forth in steps 206 to 213 and described immediately hereafter is suitable not only for compiled hypertext material, but also for text files and text stream compression in any information storage and retrieval system.

In step 206, each instance of a unique word within the text is identified. Then, in step 208, the compiler selects a canonical vocabulary (or dictionary) that includes a portion of the unique words identified in the text. The compiler may have several dictionaries to choose from for this purpose. For example, separate dictionaries may include: common English words, medical terminology, chemical terminology, legal terminology, etc. . . . The compiler 50 chooses one or more of the dictionaries as appropriate in order to include a large percentage of the unique words identified within the text.

These dictionaries can be used either individually or in combination. Each dictionary has a plurality of vocabulary words in it and numbers (or tokens) corresponding to each vocabulary word. The lists of words and tokens in each of the predetermined dictionaries are separated into token ranges that correspond to the expected frequency of words in the natural language as a whole. All predetermined dictionaries have at least one word list and token range included in them but any number of additional token ranges can be present.

Figure 9:
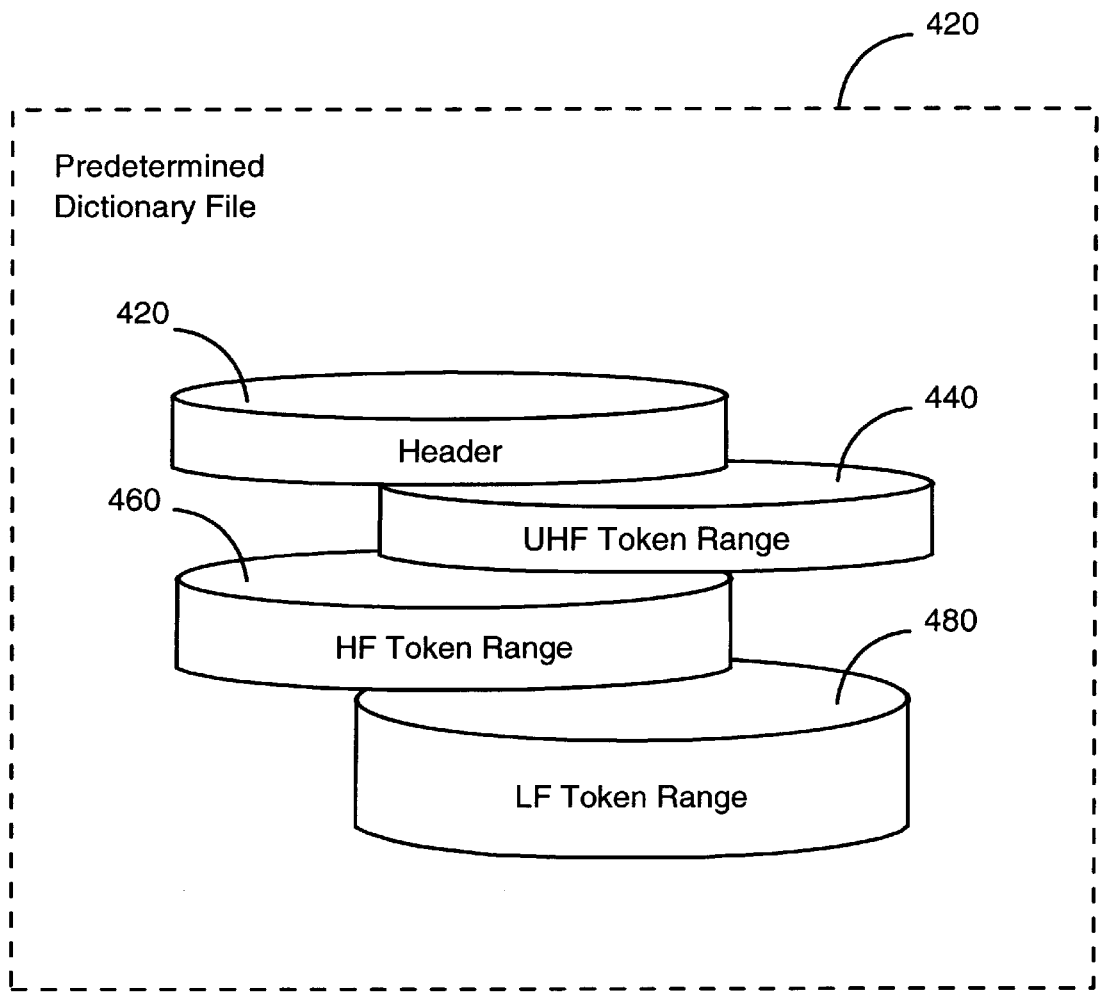
FIG. 9 depicts a predetermined dictionary file that used during compression or compilation according to a preferred embodiment of the present invention.

FIG. 9 shows a typical natural language dictionary file 400 that includes a header 420 and three token ranges. The most frequently occurring words within the natural language are assigned a token with the Ultra-High Frequency ("UHF") token range 440. The next most frequent words are similarly assigned values in the High Frequency ("HF") token range 460, and the least frequent words are assigned value in the Low-Frequency ("LF") token range 480. Most of the words in a particular natural language are considered very infrequent (called very low frequency or VLF vocabulary) and are not included in the predetermined dictionary for that particular natural language. The way each predetermined dictionary is structured (how many and what sized token ranges are present) is a function of the common usage of words in a particular natural language and not of the word occurrence in any particular document corpus.

In step 208, in order to select a dictionary, the compiler or a compression processor automatically samples all, or portions, of the text in a document to be compressed and determines an approximation of what percentage of terms in the document appear in particular predetermined dictionaries. Alternatively, the end user may specify manually what dictionaries the system should employ for encoding a particular document.

The compiler 50 employs mechanisms for making use of multiple dictionaries, each specifying its own encoding. Each dictionary specifies a correspondence between words and encoded token numbers to the same base number (usually 1). When multiple dictionaries are used in encoding a single document (say English and French for example) one of two possible schemes is used for permitting the token ranges of the dictionaries to be merged. When a small number of dictionaries, containing a relatively small number of entries are to be used simultaneously, a single unified token range can be dynamically constructed as a document and is encoded and compressed. To this end each dictionary used for encoding is assigned offset values for each of the token ranges it embodies. These offset values are recorded in the header 420 of the dictionary file 400 as dictionaries are selected for use.

Figure 10:
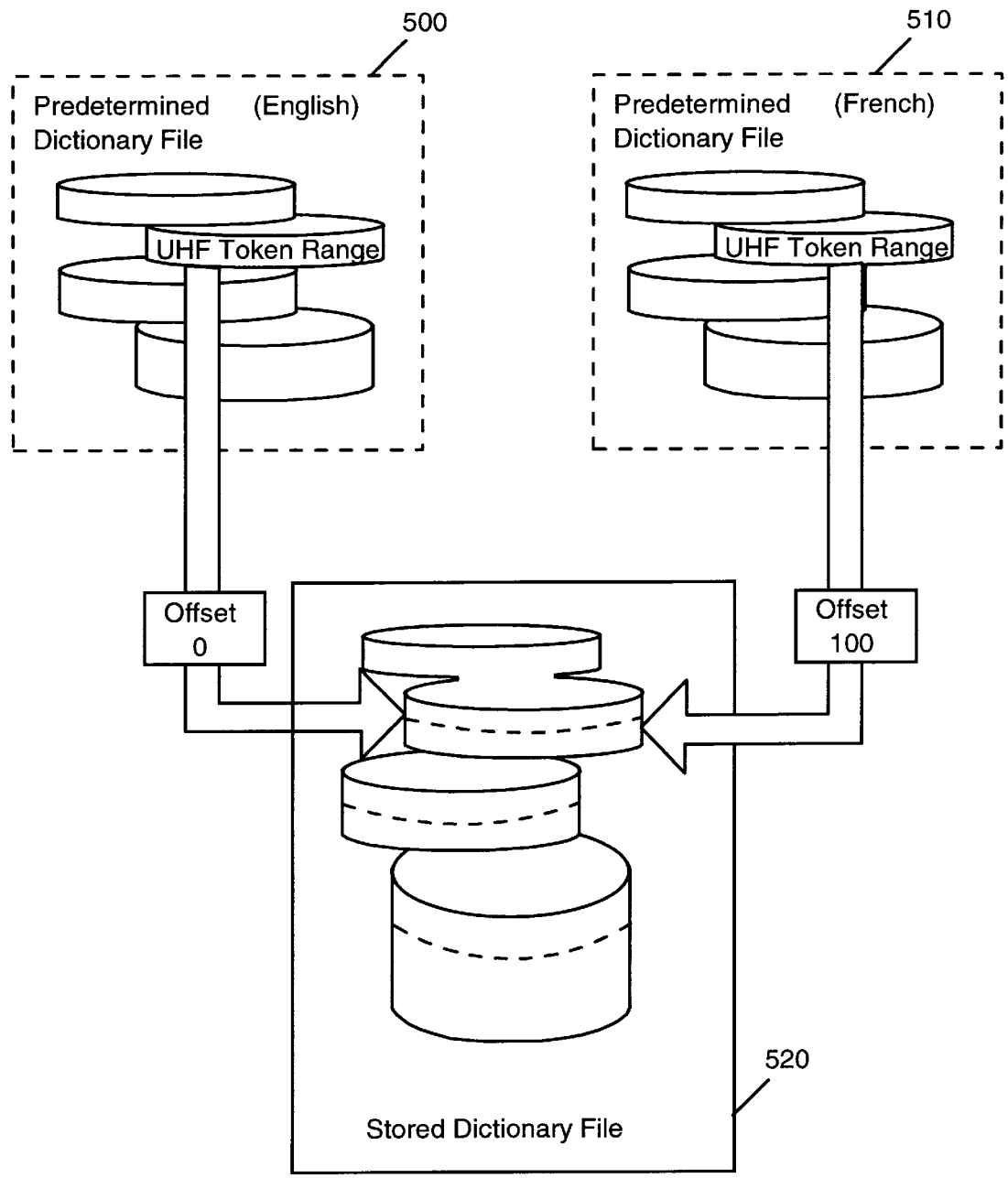
FIG. 10 depicts the mapping of token ranges from two predetermined dictionary files into a store dictionary file according to a preferred embodiment of the present invention.

FIG. 10 shows how the token ranges specified in each dictionary can occupy part of the overall token space. For example, in a document with both French and English words, both an English dictionary 500 and a French dictionary 510 will be used. In dictionary 500, the English words corresponding to a token range might be assigned an offset of zero and thereby correspond to tokens starting with number 1, while the French dictionary 510 uses a token range starting at offset of, for example, 100 thereby causing all of the words in the French dictionary to be numbered 101 and up in the stored dictionary file 520.

The use of dictionary offset values allows token assignments within each predetermined dictionary to be made without regard to whether a dictionary 400 may be used in combination with another dictionary 400 during the encoding of a specific document. Based on the relative frequency of occurrence of words in each token range of the English and French language, offset values are assigned to each token range. Supplemental dictionaries are similarly added dynamically to support the words not included in any predetermined dictionary. In some cases where the number of dictionaries to be supported is larger (and consequently the number of words is also larger) a special "shift" token is assigned to indicate what dictionary should be used to encode a particular body of text within the document being compressed. The shift token allows the compression routine to effectively support a much larger token space but requires that shift tokens be inserted in the compressed stream whenever the dictionary used to compress text must be changed. Both dictionary encoding methods permit the text compressed in a document to be updated, and any additional words that were not present in the original document to be accommodated in additional supplemental dictionaries that can be added later or in an extension of the existing supplemental dictionaries.

The invention may also employ special encoding for numeric strings that occur in the text. Sometimes when documents contain only occasional references to numbers, no special numeric encoding is required. In these cases each unique numeric string is simply assigned a token in the aforementioned supplemental dictionaries and encoded in the normal way that words and strings not found in any of the predetermined dictionaries are handled. However, when documents contain large numbers of unique numbers this mechanism quickly exhausts the supply of tokens available in the supplemental dictionaries. In these cases one of the two special encoding methods described below can be used.

Numbers, either integers which are just strings of digits, or decimal notation which may include signs (positive or negative), decimal points, currency symbols etc. . . . can be encoded using a special predetermined "numeric" dictionary. This dictionary includes a token range (usually one-byte) for each numeric digit (0–9) and also tokens for signs, currency symbols, exponential notation etc. When special encoding for numbers is employed some special parsing rules are also required as numeric strings do not normally include imbedded white space such as is common between other tokenized words or strings. For numeric strings this form of encoding does not achieve any real compression but it allows many numeric strings to be included in documents that also have a lot of regular language text without overloading the token addressing ranges. For documents that have extraordinarily large quantities of unique numeric strings (scientific or financial tables) yet another encoding algorithm is employed by the invention. In these cases, the numbers are converted to a machine independent binary format. This format is designed to successfully encode either integers or real numbers with nominally unlimited precision. The format specifically includes information as to how many bits of data are used to encode either very small or very large and precise numbers (mantissa and exponent lengths) and to what precision such numbers are carried in their representation. Normally such encoding schemes will achieve better compression of numbers than the previously described digit tokenization. This form of encoding also more readily allows computation and/or comparison of the numbers which in turn may be used to enable relational searches. For example, with this scheme of encoding, a search could find all numbers less than, equal to, or greater than a particular value. Of course when this form of binary encoding is used there may be precision limits on the manipulation of the numeric values that are related to the computing capabilities (register size) of a particular hardware or software platform, or the limits of the encoding (compression) algorithm implementation.

After selecting the dictionaries, the selected dictionaries are stored in the compiled file 50 in step 208 of FIG. 8. At this stage, each of the dictionaries stored within the compiled file in step 208 include words, and corresponding numbers or tokens, to uniquely identify many of the words within the text to be compressed. In step 210, each word within the text from the original material is replaced with the number or token corresponding to that word in the stored dictionaries. During compression in step 210, the input text stream is parsed into words and strings and compared with the words in the all the predetermined dictionaries selected by the language identification step 208. Words that appear in any of the selected predetermined dictionaries are replaced with appropriate token values.

Also during step 210, unusual words and strings that are not present in the any of the predetermined dictionaries during compression are identified. In step 212, the unusual words or strings are gathered into at least one supplemental dictionary and assigned token values. Special processing for numeric strings is also handled and they are converted to tokenized data as described above. The compressed token stream is written into a memory buffer and finally stored in the file in large blocks.

After compression of all of the text in step 210 and completion of all supplemental dictionaries in step 212, the predetermined dictionaries and the supplemental dictionaries are each uniquely identified by a reference record that is stored in the compiled file 50. In addition to the identification of the dictionaries used, these reference records contain the offset values and/or special "shift" token values previously mentioned that are used to partition the overall token space assigned to each dictionary.

After storage of the predetermined and supplemental dictionaries in steps 208 and 212 respectively, in step 213 the dictionaries may be further compressed using relatively standard and well known methods including front and back-end string folding and run-length encoding. In this case, the compressed predetermined dictionaries are also stored in the file.

The file compression techniques described above in steps 206–213 work particularly well for files of moderate and large sizes. Small files may achieve little or no compression effect and very small files may even grow in size. This is because of the overhead that storing copies of the predetermined dictionaries requires. If the files actually contain very few occurrences of a very small number of unique words, then even with no predetermined dictionary being used and all words that do occur in the material being placed in a supplemental dictionary the resulting file would likely be slightly larger than the input file. In most cases for moderately sized files (several dozen pages of text at least) files compressed using the techniques described above are typically 2 to 10 times smaller than the input source file that they were generated from.

After the compression in step 213 is complete, the tokenized or compressed text is then stored in the compiled file 50 in step 214. When the compressed text is stored within a compiled file, the correspondence between the text and the tags is also updated to reflect the stored location of the compressed text within the compiled file.

In step 216, the set of unique words from within the text is tokenized and stored as a search index in the compiled file 52. In step 218, the objects embedded in the hypertext files are compressed beyond their native format using compression techniques. In step 220, the compressed objects are stored in the compiled file 52 and the correspondence between the tags and the objects is updated to reflect the stored location of the compressed objects. In step 222, the compiler stores the tags that were parsed from the hypertext files. The tags are stored hierarchically in a binary tree format with a pointer relating each tag to the location within the compressed file that has the corresponding compressed text or object.

When a tag is a hypertext link, the tag is treated differently depending upon whether the material linked to is presently within the compiled file 52 or not. When a hypertext link tag in one of the input objects is not a link to another object included within the compiled file 52, the hypertext link tag includes a pointer to the compressed text area of the compiled file. The compressed text pointed to includes the hypertext address (URL in HTML) of the file pointed to in the original material. When the hypertext link tag specifies an object that is included in the compiled file 52, the pointer corresponding to the referring hypertext link tag points to a tag within the compiled file 52 representing the top of the hierarchy of the included material.

Transmission and Processing of a Compiled File

Figure 11:
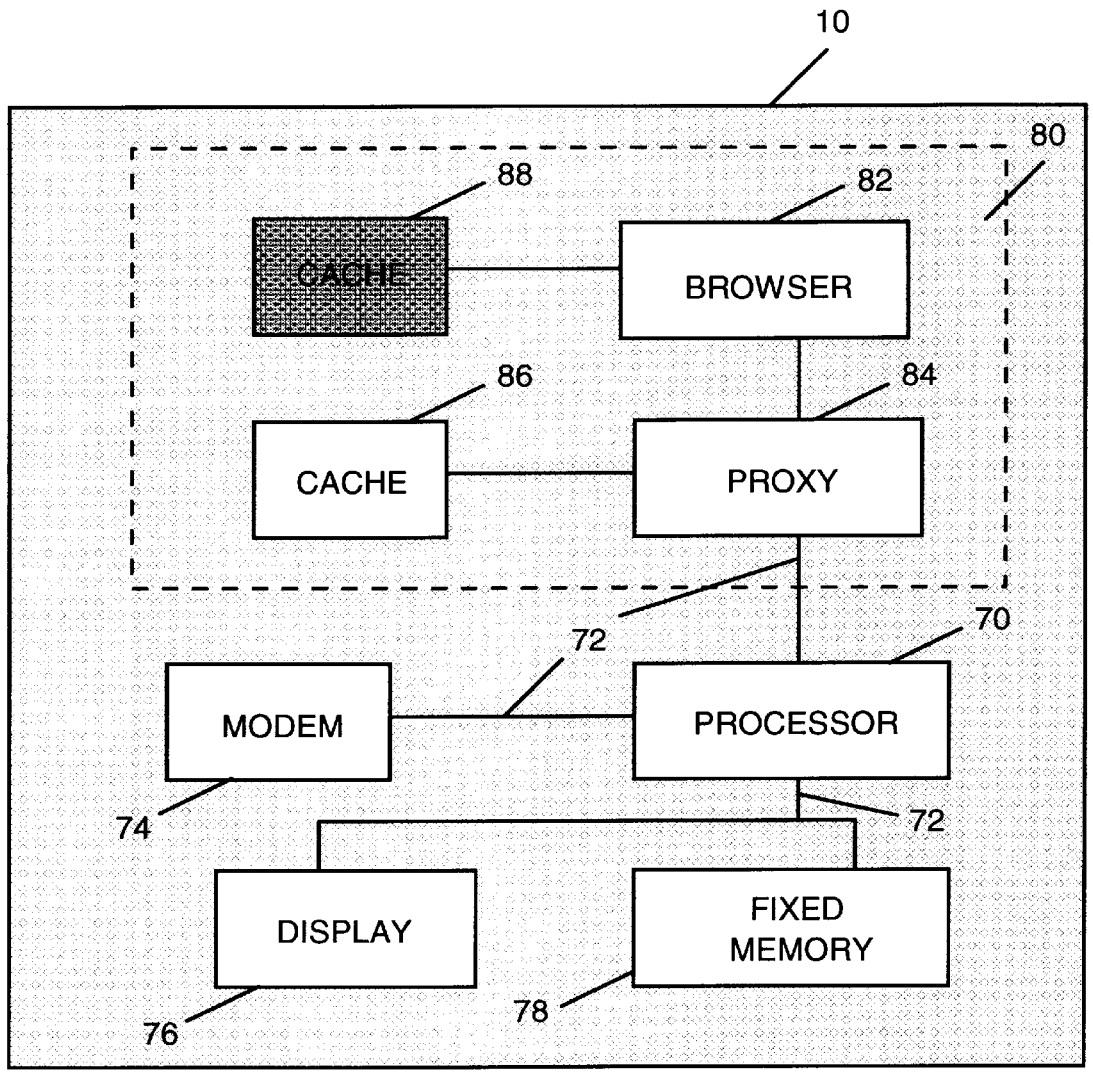
FIG. 11 depicts an exploded view of a client computer with browser and proxy software residing in the memory of the client computer.

FIG. 11 depicts an exploded view of a client computer 10. The client computer 10 includes a processor 70 coupled over a bus 72 to a modem, 74 a display 76, fixed memory 78, and random access memory (RAM) 80. The bus 72 enables communication between the various components of the client computer 10. The fixed memory 78 contains programs stored on a computer usable medium and capacity to store additional data on the medium. The processor 70 loads programs into the RAM 80 and executes the programs, which include operating systems and applications. Typical operating systems are Microsoft DOS and Windows, Unix, Aix, and OS2. The applications include a browser 82 for accessing the internet using HTTP protocols and rendering web pages on the user's display. There are many widely available browser programs including Netscape Navigator, Mosaic, and Microsoft's Internet Explorer. The applications may also include a proxy 84, described in more detail below, which interfaces with the browser 82, the processor 70, and the modem 74 over the bus 72. Additionally, a cache 86 may be implemented by the RAM 80 (or the fixed memory 78). The cache 86 is operative to temporarily store data as required by the browser 82 and/or the proxy 84 at the direction of the processor 70.

The modem 74 is coupled between the processor 70 and a communication medium used to access the internet, such as a telephone network, which may include, for example, wired, cellular, microwave, and satellite portions thereof. The modem 74 receives data, including commands, from the browser 82 and the proxy 84 and transmits the data to servers over the internet. Additionally, the modem 74 receives data from servers on the internet and routes the data to the proxy 84 and the browser 82 applications.

Figure 12:
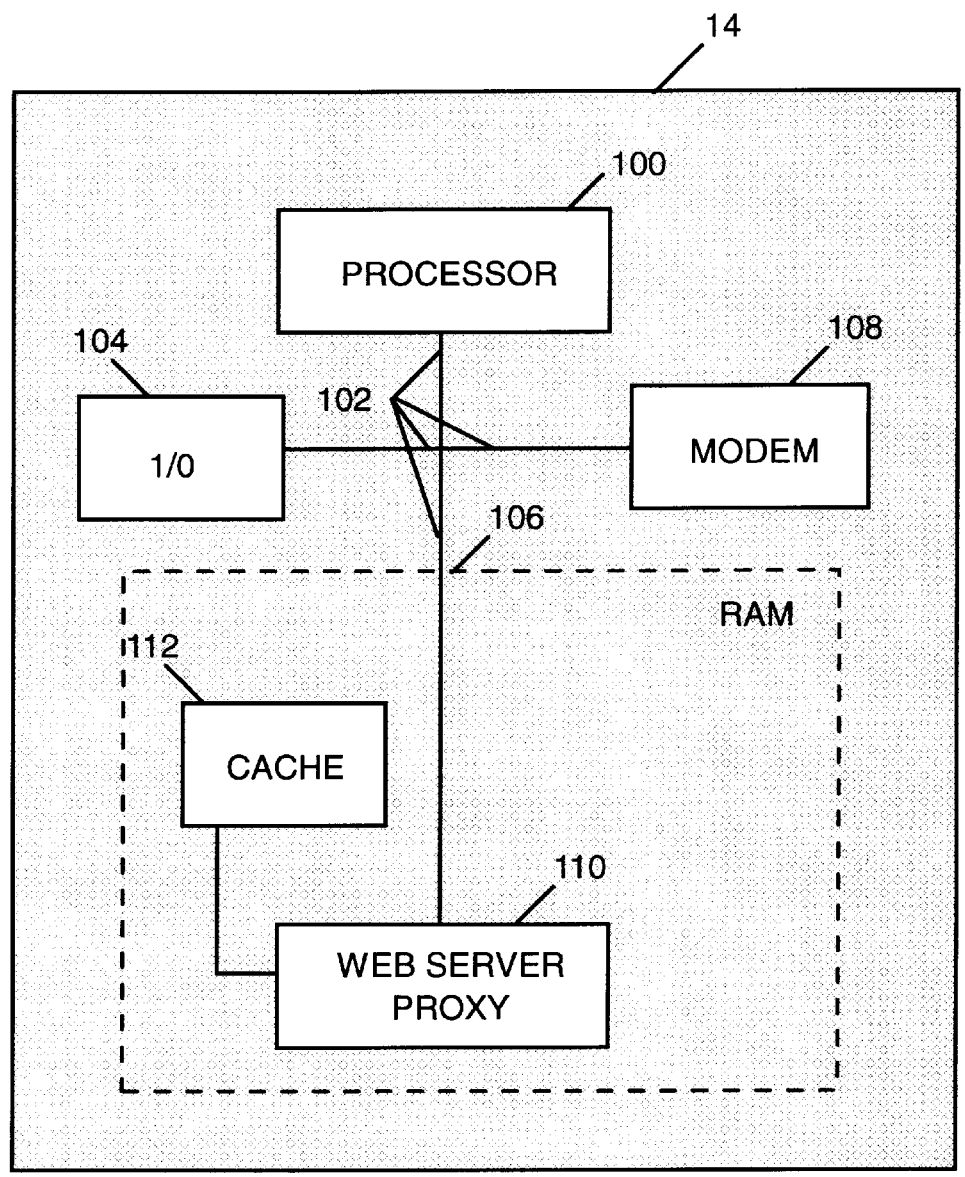
FIG. 12 depicts an exploded view of an internet access server used to couple a client computer to the internet.

FIG. 12 depicts an exploded view of an internet access server 14 used to couple a client computer 10 to the internet 16. The internet access server 14 may be owned and operated by an internet service provider, or the internet access server may be part of for example, a private local or wide area network that includes the client computer 10. The server 14 includes a processor 100 coupled over a bus 102 to one or more input/output devices 104 and a memory 106.

The memory 106 includes, for example a RAM a read only memory (ROM), a hard disk drive or an array of hard disk drives, a tape drive, a CD ROM drive, and controller. The input/output devices 104 transmit and receive data using communication protocols including TCP/IP, and in so doing route data from the server 14 to another server or from the server 14 to a client. The input/output devices 104 are controlled by the processor 100, which directs the flow of data received and transmitted. The processor 100 runs programs stored in the memory 106, including operating systems and applications. Also included among the programs stored in the memory 106 in a preferred embodiment of the invention is a server proxy 110. The server proxy 110 includes program instructions for translating a compiled hypertext file into it uncompiled format, and for determining when the browser 82 includes a personal proxy 84 capable of reading a compiled file 52. A cache 112 is preferably implemented by the components of the memory 106 and coupled to the server proxy 110. The cache 112 is used to temporarily store data at the direction of the proxy 110.

A modem 108 may also be included in the internet access server 14, particularly when the internet access server 14 is an internet service provider. The modem 108 is coupled to the processor 100 over the bus 102 and receives requests for access to the internet from and exchanges data with client computers 10.

Figure 13:
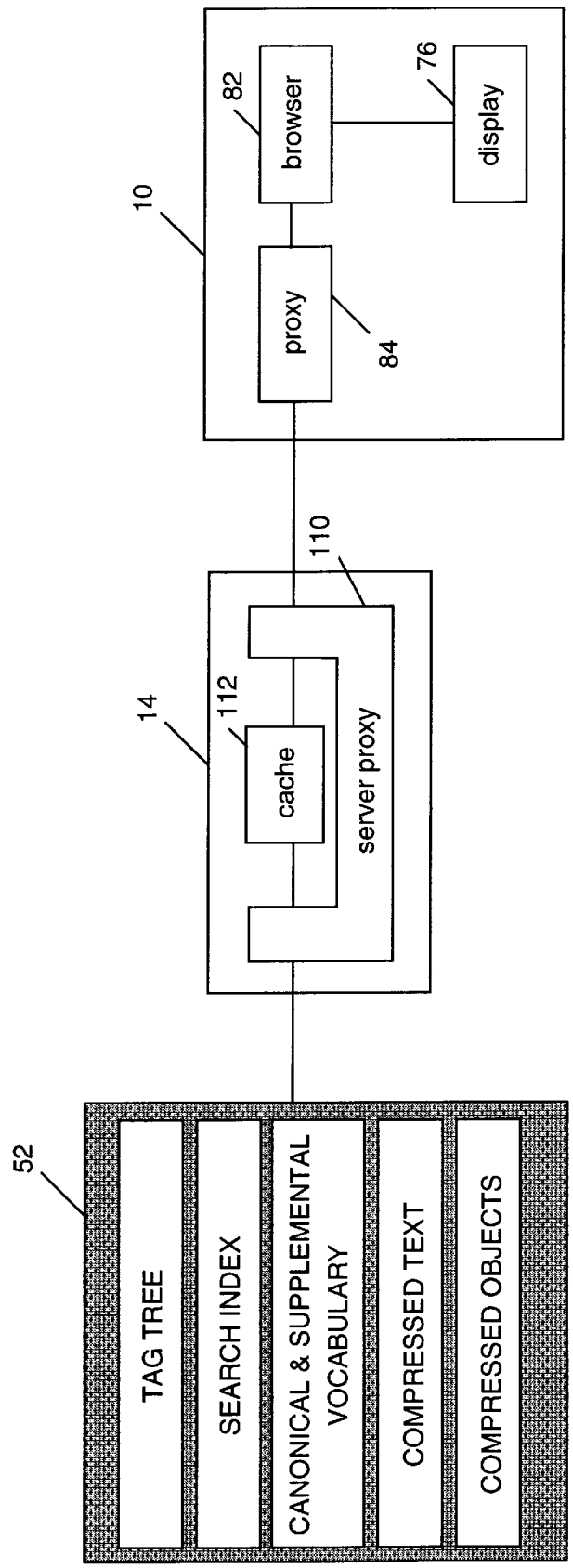
FIG. 13 illustrates a client computer coupled to a remote server computer through an internet access server.

In FIG. 13, a browser program 82 is running on a client computer 10 that is coupled to an internet access provider 14 (either via a modem or a local area network). When the browser 82 is initiated, it typically is set to an HTML file or web page located at a remote server 12 having a predetermined URL stored in the browser 82. From this location, the user may select a hypertext link to jump to another hypertext page. There are many ways to accomplish this including by typing in a new address and selecting a hypertext link. Assume for purposes of illustration that the user selects the URL of a web page of the remote server 12 depicted in FIG. 13.

Upon selecting the URL, the browser 82 transmits the URL request to a program known as a proxy server, or simply a proxy. A proxy is an intermediate program running on a computer in the internet that accepts requests from client computers (or other proxy servers) in the network, that performs some processing and then passes some or all of the requests either as transformed by the intermediate processing or intact onto another server (or another proxy server). Such a proxy may be located in any computer that lies anywhere logically in the path between the client computer 10 and the server computer 12 including but not limited to computers provided by the internet access provider 14 (which may be an internet service provider or a server on a local area network) and also either in the client computer 10 or the server computer 14. These scenarios are depicted by the proxy 110 in the internet access provider 14 and by the proxy 84 in the client computer 10. Such proxies can be used for many purposes in the internet including as intermediate caches, security gateways or address transformers.

In one embodiment of the invention, a proxy is located either in the network (between the client and remote server computers) or on the client computer 10 to cache, decompile and decompress the compiled HTML information when it is delivered from a remote server 12. When information is requested from a remote server 12, the proxy receives the request from the web browser and in turn contacts the remote server specified by the request.

Regardless of whether the proxy is running in the client computer 10 or somewhere else in the network, the proxy always adds some information to the request to enable the remote server 12 to determine that there is a proxy in-line somewhere that is capable of dealing with the compiled HTML format. This additional information typically consists of some modification to the URL being requested that can be easily detected by the remote server 12. When the remote server 12 receives a request without this modification, then it determines that neither the client 10 nor any servers between the client 10 and the remote server 12 is equipped with a proxy capable of translating compiled hypertext material. Therefore, the remote server 12 must decompress and decompile the requested data within the stored, compiled file 52 prior to transmission to the requester. When a remote server 12 receives a request from a proxy with the detectable modified address (URL), it transmits all or part of the requested information in the compiled and compressed form.

When a proxy receives the compiled material 52 from the remote server 12, it can perform a translation of the compiled format. In its initial transmission, the remote server 12 sends certain of the basic components of the compiled information 52 to the proxy. These include at least the identification of which canonical vocabularies and supplemental vocabularies 58 are being used in the compiled file 52 as well as the part of the tag tree 54 that included the requested address (URL). Usually, the initial transmission will also include at least the text of the requested information. At the discretion of the remote server 12, it may also include other data including additional segments from the tag tree 54, compressed text 62, components of the search index 56 and/or non-text compressed objects 62 (like images, sounds or video files). The proxy will receive and temporarily store in a cache all of these compiled components in their compressed form.

At this point the proxy has accumulated enough information to begin transmitting to the browser 82 for rendering. Since it has received a complete summary of the structure of the hypertext information in the tag tree, the proxy Xl can determine without any reference to the tags what components it needs to transmit to the browser 82 (and in what order to transmit them) to allow the browser 82 to begin rendering as quickly as possible. Usually, most of the required components for rendering the requested material are transmitted by the remote server 10 in this initial transmission. If, however, the proxy determines that additional components are required (such as particularly large image or video files) by processing the tag tree 54 of the compiled file 52 that the proxy has received and cached, the proxy requests the additional components from the remote server 12 even while transmitting already received components to the browser 82 for rendering. When the proxy sends material to the browser 82, it decompiles and decompresses the compiled object effectively reconstructing the original format from the cached compiled components. Since the browser 82 does not have to decompile or decompress the compiled hypertext format itself, existing commercially available browser programs such as Netscape Navigator, or Microsoft Internet Explorer can be used.

Under the prior art, the transmission of information from the remote server 12 to the browser 82 on the client computer 10 was slow because the text and images were not compressed beyond their native format. According to the present invention, the text and embedded object data are both stored and transmitted in compressed format. Thus, the same amount of text and object data is transmitted with fewer bytes according to the present invention. This results in significantly faster transmission time for a compiled hypertext file 52 as compared to an HTML file of the prior art. Another advantage is that the tag tree 54 in the compiled file 52 is readily available without parsing. Therefore, both the remote server 12 and the proxy can efficiently determine, based on the tag tree 54 in the compiled file 52 and the information transmitted what components are needed to render the page. The required information can be transmitted in fewer transmissions, without the browser 82 having to explicitly request each additional file or object that it needs from the remote server 12. Finally, since the compiled components stored in the proxy cache remain compressed until they are transmitted to the browser, the amount of data that can be retained in the proxy cache to satisfy further requests is increased. Ultimately, this will further reduce the number and size of required transmissions between the remote server 12 and the browser 82.

Even while the browser 82 is rendering a requested web page, the proxy may continue to receive and/or request additional compressed text and objects on other web pages included within the scope of the compiled HTML document. For example the proxy may process the tag tree and prefetch material corresponding to hypertext links within the information being rendered by the browser as described below.

Furthermore, the functions of the proxy allowing it to receive, cache, and interpret the compiled file 52 could be incorporated in some browser programs allowing them to operate on the compiled data directly without requiring the intermediation of a proxy.

Transmission and Processing of a Compressed File

When a file compressed by the methods described in steps 206 to 213 of FIG. 5 is used in a distributed system, such as a the world-wide web, the nature of the encoding scheme allows several efficiencies beyond the obviously reduced time and input/output operations that transmission and/or retrieval of the smaller body of material yields.

When files compressed by the above methods are transmitted in a distributed system the unique identifications of the required dictionaries that were employed in the compression can be transmitted. If the receiving computer does not already have copies of those dictionaries either cached in memory or on secondary storage the copies encoded in the file can be transmitted. Usually, since many documents are compressed with the same predetermined vocabularies this transmission can be avoided. While, in principle, this method could also be used to avoid storing the predetermined dictionaries in the compressed file, it is actually not efficient to do so as this might require a computer that needs to decompress a file to search for and obtain the required dictionaries from another source. In any case the supplemental dictionaries are transmitted. In addition to the transmission efficiency achieved by multiple use of predetermined dictionaries there is a similar advantage that accrues when a caching mechanism is employed for the dictionaries. Since the same dictionary can be used to encode many documents the cache space utilized by the higher frequency token ranges in that dictionary is effectively shared among the multiple uses.

Decompression of the tokenized material for rendering at a display screen or printing is similarly very efficient. Since all the tokens that represent words or strings have fixed lengths (usually, but not always, 1–4 bytes) and are organized in blocks on the file, a decompression routine can pass rapidly through the token stream and find each token without any real parsing. This also means that, unlike in many schemes that employ end-to-end binary compression, a portion of the file composed only of some data from one or more blocks can be decompressed without reading or decompressing any other block from secondary storage (disk) or memory.

In addition to the reduced time to transmit or retrieve the stored material the compressed tokenized form of the text can be searched directly without requiring decompression. This is accomplished by using the referenced predetermined and supplementary dictionaries to "lookup" the tokens for any search words, phrases or strings that are to be found. Once these search targets are appropriately tokenized with the same vocabulary that was used to encode the source material the required token sequences can be searched for instead of the actual character strings. Since, in general the strings of bits that must be compared in such a tokenized matching are much shorter than the words they represent the search can proceed much more rapidly.

Optimization of Transmission

Transmission of information between a remote server 12 and client computers 10 can be optimized by prefetching the hypertext links on a requested web page and transmitting their contents to the client computers 10 that are viewing the web page. When a user takes a link to a web page that has been prefetched, the web page already resides in a cache 84 on the client computer 10 and therefore, the browser 82 only needs to render it rather than to fetch it and render it. This reduces the time required to satisfy and render the browser's request for the linked web page.

Prior art programs can be added to existing web browsers to examine the received hypertext material for links and to make asynchronous requests for the referenced pages. These programs, however, cannot determine which of the links on the originally requested web page the user is most likely to choose.

Figure 14:
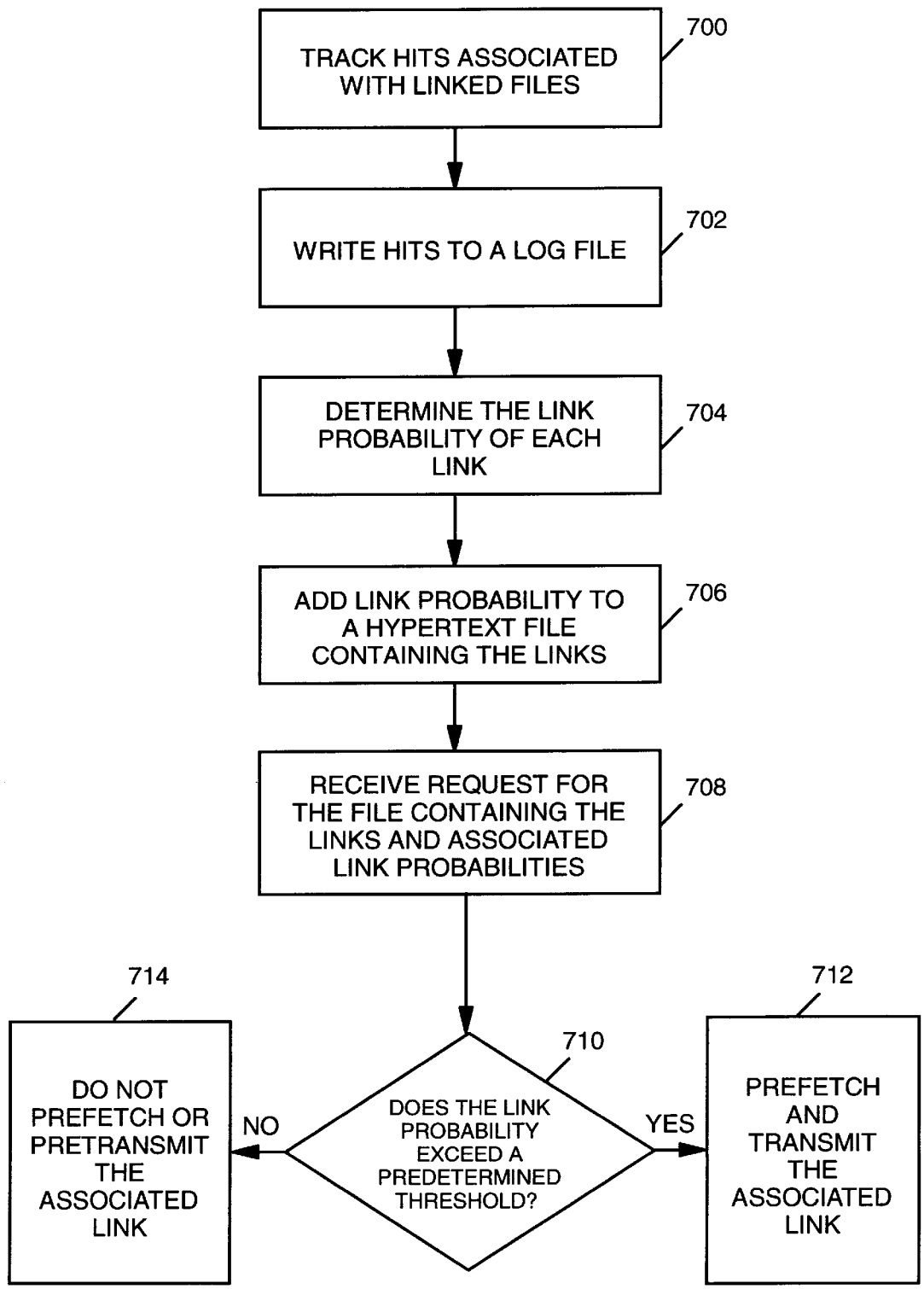
FIG. 14 depicts a method for optimizing transmission of remote hyperlinked files according to a preferred embodiment of the present invention.

In a preferred embodiment of this invention, the prefetching behavior of the proxy at the client computer 10 (or close to the client computer 10 in a client-side network configuration) and the remote server 12 are governed by statistics stored within an uncompiled or a compiled hypertext file 52. This is illustrated in FIG. 14.

First, during normal operation of the remote server 12 for some period of time, reference statistics for pages must be generated and associated with a compiled or uncompiled file 52. This is accomplished by tracking in step 700 the reference to hypertext address (URLs) and relating the hit statistics to the associated hypertext links within files that were previously requested from the same client computer. When the remote server actively responds to queries from client computers during the course of operation, the remote server writes in step 702 an activity log to a storage medium, for example a log tape. The activity log records each instance of a client's accessing a hypertext object on the server over a period of time. This activity log can be analyzed in step 704 with respect to the links on each previously requested page, in order to determine a probability of selection for each hypertext ed on the page. Hereinafter, this probability is called the link probability.

Once the fink probability has been determined, according to the present invention, the link probability information may be added in step 706 to an uncompiled hypertext file manually or automatically. Furthermore, the link probability can be added to a compiled hypertext file 52 manually or automatically during the compilation of the file 52. This may be accomplished, for example, by storing the link probability as a comment tag in the hypertext file or in the compiled file 52. The comment is related to the corresponding hypertext link by storing the comment tag and associated comment immediately before or after the hypertext link tag within the file or compiled file 52.

During transmission of a hypertext page having link probabilities included therein from a remote server 12 to a client computer 10 that includes a proxy 84, both the remote server 12 and the proxy 84 may read the link probabilities in step 708. Based on the link probabilities, the proxy 84 or the remote server 12 can make independent or concerted decisions to prefetch or pretransmit data that is referenced by links included within the explicitly requested information. For example, if the remote server computer 12 has available bandwidth, the server 12 may add the tags, text or other objects referenced by the links in an explicitly requested page to material it is transmitting to the proxy. Then, when (and if) the user takes the hyperlink, the requested material will already be stored in the cache 86 on the client computer 10. Likewise the proxy 84 may use the link probability data to explicitly request data for pages that are most likely choices even while it is still transmitting received data that is required to the web browser 82. In step 710, the remote server 12 or the proxy 84 determines if the link probability exceeds a predetermined threshold. If so, in step 712 the server 12 or the proxy 84 pretransmit or prefetch those links having a high link probability. If not, in step 714 the server 12 or the proxy 84 do not prefetch or pretransmit those links having a low link probability.

To further optimize the use of bandwidth and cache space, the remote server 12 may track data requests from a client 10. Based on the client's requests, the server 12 may be able to determine that the client 10 has only limited cache space because the client 10 frequently requests the same data that has already been sent. In this scenario, the server 12 can adjust its pretransmission behavior and not prefetch anything for the client 10, because the client 10 will not have the cache 86 capacity to store the data once fetched. Although specific embodiments of the invention have been disclosed, it will be understood by those having ordinary skill in the art that changes can be made to those specific embodiments without departing from the spirit and the scope of the invention.

What is claimed is:

1. A method for compressing text into a compressed file, comprising the steps of:

parsing words from text in an input file;

comparing the parsed words to a first predetermined dictionary having a plurality of vocabulary words and corresponding numbers to the text;

determining which of the parsed words are not present in the first predetermined dictionary;

creating at least one supplemental dictionary including the parsed words not present in the first predetermined dictionary;

storing the first predetermined dictionary in a compressed file together with the supplemental dictionary;

replacing the parsed words with numbers corresponding to the numbers assigned in the first predetermined and supplemental dictionary; and storing into the compressed file the numbers in place of the corresponding words of the text.

2. A method for compressing text according to claim 1, wherein the input file is a hypertext file.

3. A method for compressing text according to claim 1, wherein the input file is composed using at least two natural languages, further comprising the steps of comparing the parsed words to a second predetermined dictionary;

determining which of the parsed words are not present in the second predetermined dictionary;

creating the at least one supplemental dictionary including the parsed words not present in the first and second predetermined dictionaries;

storing the first and second predetermined dictionaries in the compressed file together with the supplemental dictionary; and replacing the parsed words with numbers corresponding to the numbers assigned in the first and second predetermined and supplemental dictionaries.

4. The method according to claim 3, wherein the tokens in the second predetermined dictionary are assigned an offset value.

5. The method according to claim 3, wherein the first and second predetermined dictionaries each include a header and first and second token ranges, the first token range including tokens corresponding to words having a first frequency of occurrence within the natural language represented by the first and second respective predetermined dictionaries and the second token range including tokens corresponding to words having a second frequency of occurrence within the natural language represented by the first and the second respective predetermined dictionaries.

6. The method according to claim 5, wherein the first and second token ranges within the first and second predetermined dictionaries are assigned non-conflicting offset values prior to the steps of replacing and storing.

7. The method according to claim 2, wherein the hypertext file resides on a remote server coupled to the internet, further comprising the steps of:

transmitting the compressed file from the remote server to a browser over the internet.

8. The method according to claim 1, wherein the compressed file is transmitted to the browser without the predetermined dictionary.

9. A method of uncompressing a compressed hypertext markup language file received from a remote server on the internet, comprising the steps of:

receiving at a system coupled to the internet a header of a compressed file, the compressed file including a plurality of tokens and a predetermined and supplemental dictionary that each relate tokens with corresponding text, and the header identifying the predetermined dictionary;

analyzing the header of the compressed file to determine whether the predetermined dictionary is stored on the system;

requesting transmission of the predetermined dictionary from the remote server when not present on the system;

receiving the compressed text from the remote server and replacing each token within the compressed text with the corresponding text based on the content of the predetermined and supplemental dictionaries.

\* \* \* \* \*